United States Patent [19]

Carrig et al.

[11] Patent Number: 5,339,253
[45] Date of Patent: Aug. 16, 1994

[54] METHOD AND APPARATUS FOR MAKING A SKEW-CONTROLLED SIGNAL DISTRIBUTION NETWORK

[75] Inventors: Keith M. Carrig, Jericho; David J. Hathaway, Underhill Center; Keith W. Lallier, Essex Junction; Jeannie T. H. Panner, Underhill Center; Terrence W. Sehr, Jericho, all of Vt.

[73] Assignee: International Business Machines Corporation, Armonk, N.Y.

[21] Appl. No.: 715,178

[22] Filed: Jun. 14, 1991

[51] Int. Cl.$^5$ ............................................. G06F 15/60
[52] U.S. Cl. .................... 364/489; 364/488; 364/490
[58] Field of Search ............... 364/488, 489, 490, 491, 364/578; 307/480

[56] References Cited

U.S. PATENT DOCUMENTS

| | | | |
|---|---|---|---|
| 4,484,292 | 11/1984 | Hong et al. | 364/491 |
| 4,811,237 | 3/1989 | Putatunda et al. | 364/491 |
| 5,109,168 | 4/1992 | Rusu | 307/480 |
| 5,113,352 | 5/1992 | Finnerty | 364/490 |
| 5,168,455 | 12/1992 | Hooper | 364/490 |
| 5,172,330 | 12/1992 | Watanabe et al. | 364/491 |
| 5,197,015 | 3/1993 | Hartoog et al. | 364/490 |
| 5,218,551 | 6/1993 | Agrawal et al. | 364/491 |

Primary Examiner—Thomas G. Black
Assistant Examiner—Leigh Marie Garbowski
Attorney, Agent, or Firm—Heslin & Rothenberg

[57] ABSTRACT

A signal distribution tree is constructed from the leaves to the root by pairing sinks having similar locations, latency requirements and generating function requirements, then determining the minimum cost route or routes between paired sinks, establishing at least one drive point for each minimum cost path which drive point will satisfy the latency requirements for the pair of sinks it serves and then treating each resulting set of drive points as a new sink to be paired while removing the initial sinks from the list of sinks to be paired, continuing this process iteratively until a single set of drive points results and, finally, connecting the signal source to one of the drive points in the final set.

28 Claims, 13 Drawing Sheets

METHOD AND APPARATUS FOR MAKING A SKEW-CONTROLLED SIGNAL DISTRIBUTION NETWORK

FIELD OF THE INVENTION

The present invention relates to a method and an apparatus for distributing signals in a logic network so as to control the skew between the arrival times of the signals.

BACKGROUND OF THE INVENTION

Signals in digital electronic systems must often be connected to many different circuit inputs, or sinks. In many cases, as with a clock signal, it is important that the difference in the arrival time of the signal at these various sinks, also known as the skew of the signal, be as small as possible, as this skew directly adds to the cycle time of the machine. In other cases, the objective is not to have the signal arrive at all sinks at the same time, but to maintain a certain fixed relationship or skew between the arrival times at different sinks. In both of these cases, it is important to minimize the amount of wiring required to achieve the desired skew, both to reduce the overall loading of the signal and to avoid unnecessary use of the limited "real estate" found on VLSI chips and other devices.

The following previous methods are described in various combinations in "Circuits, Interconnections, and Packaging for VLSI", Addison-Wesley, 1990, by H. B. Bakoglu; "High Performance Clock Distribution for CMOS ASICs", Proceedings of the 1989 CICC, p. 15.4.1 by Scot Boon, et al.; "SDC Cell—A novel CMOS/BiCMOS Design Methodology for Mainframe Arithmetic Module Generation", Proceedings of the 1989 CICC, p. 17.7.1 by Takehisa Hayashi, et al.; "A Hierarchical Floor-Planning, Placement, and Routing Tool for Sea-of-Gates Designs", Proceedings of the 1989 CICC, p. 3.3.1 by Charles Ng, et al.; and "Clock System Design", IEEE Design and Test of Computers, vol. 5, no. 5, October 1988, pp. 9–27 by Kenneth D. Wagner:

1. Use of special fixed wiring structures to distribute clock signals in order to minimize skew. This method is deficient in that it cannot adapt to nonuniform distributions of signal sinks.

2. Use of special buffer circuits capable of driving very large loads with small variations in delay to drive the signals whose skew is to be controlled and adjustment of the capacitive load on signals to equalize the delay through the buffers driving various signals whose skews are to be minimized. Both of these methods minimize the skew due to the delay through the buffers driving the signals, but are deficient in that they do not reduce the skew due to differences in the RC delays on the wiring feeding the different sinks of a signal.

3. Selection of special wire widths for clock distribution of signals whose skew is to be controlled in order to reduce the RC delay to the various sinks of the signal. This method is deficient in that these wide wires increase the capacitive loading on the circuits driving them, increasing the delay of those circuits, in that they require more area, reducing the wirability of the network, and in that the reduction in RC delay (and therefore skew) which can be achieved is limited by the product of the resistance per unit length of the wiring material and the capacitance per unit length of that material, which does not continue to decrease as the wire width increases, but reaches an asymptotic limit.

"Routing Techniques for Clock-Skew Minimization", 1990 Research Summary, U.C. Berkeley EECS-/ERL, p. 17 by Michael Jackson and Arvind Scinivasan describes a method for building a signal distribution network as a tree, starting at the root of the tree (the source of the signal). This method is deficient in that a level of the tree is generated before the loading on other levels fed by them is known, so construction of said level cannot be optimized to account for the delay through said other levels.

"Clock Tree Synthesis for Large Gate Arrays", CADENCE Semicustom Design Guide, 1989, p. 32 by Al Chao describes another method for reducing skew in clock distribution network.

SUMMARY OF THE INVENTION

It is an object of the present invention to provide a method and an apparatus for distributing at least one signal in a logic network such that the skew between the arrival times of the at least one signal at the various sinks to which it is connected meets a specified objective.

It is a further objective of the invention to provide a method and apparatus for distributing at least one signal in a logic network in such a way that the amount of additional wiring required to balance the skew between the sinks of the at least one signal is minimized.

The method and apparatus of the invention accomplish these and other objectives by:
creating a list of sinks to be connected;
pairing the sinks to be connected such that the sinks of each pair are to be connected to the same signal, are located close to each other, and have arrival time requirements which are close to each other;
determining for each pair of sinks at least one minimum cost wiring route which could be used to connect them;
establishing a "driving point" on each minimum cost wiring route which will satisfy the relative arrival time requirements of the sinks connected by said minimum cost wiring route;
adding, as alternative locations for a single new sink, the set of established driving points for each pair of sinks to the list of sinks to be connected;
removing the paired sinks from the list of sinks to be connected;
repeating said pairing, determining, establishing, adding and removing, steps until the list of sinks to be connected contains only a single sink to be connected to each signal;
connecting said single sink for each signal to the source of the signal; and
adjusting the delay of each signal to satisfy the relative arrival time requirements between the signals by delaying the signals arriving earlier than specified relative to the arrival times of the other signals.

DETAILED DESCRIPTION OF THE DRAWINGS

It should be noted in the following description that drive points are sometimes called sinks because, in effect, they become sinks and are processed as sinks after the original sinks are processed. Thus, depending upon the context, a drive point might be referred to as a sink.

Figure 1:
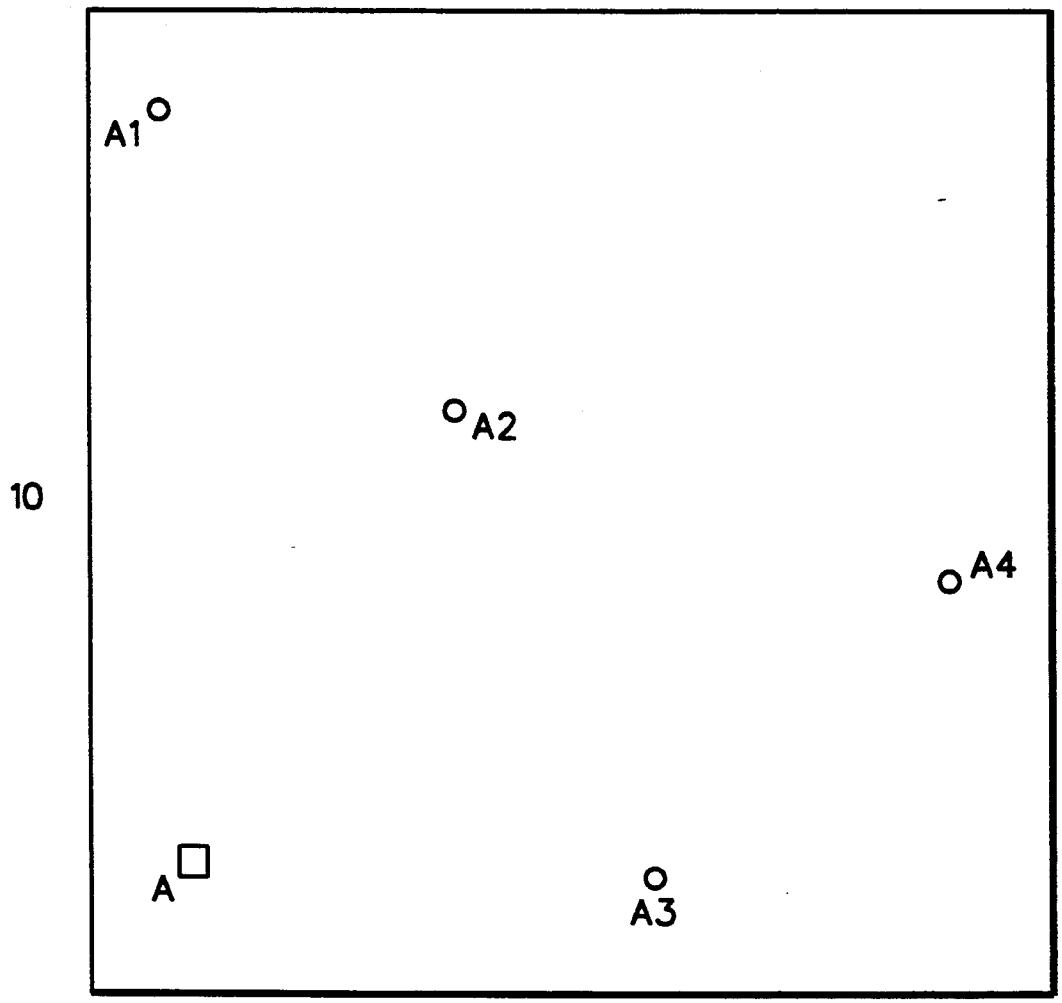
FIG. 1 shows a circuit chip containing a number of sinks and a signal source to which they are to be connected.

FIG. 1 illustrates a VLSI chip (10) containing four sinks, A1, A2, A3 and A4 as well as a signal source A which is to be connected to each sink. Although FIG. 1 illustrates a VLSI chip, it is to be understood that the subject invention is applicable to the problem of making signal distribution trees for circuit cards and circuit boards as well. Also, it is to be understood that the subject invention is applicable to the problems of making signal distribution trees for circuit cards containing several chips to which signals are to be distributed and, similarly, to the problem of making signal distribution trees for circuit boards containing several cards to which signals are to be distributed.

As in any typical case, it may be assumed that the latency requirement for each sink may or may not be the same. Also, each sink will have a capacitive load which may or may not be the same as the others. Of course, in attempting to create a suitable distribution tree for the application of the signal from one or more signal sources to each of the sinks one must know the precise latency requirement, signal function requirement and capacitive load for each sink and such information is readily available. Additional information available for the creation of a suitable distribution tree includes the possible physical locations on the chip (10) of each of the sinks and the signal source. Each may have a number of possible locations. Note that the set of alternative points which may serve as the location of a sink or a source may in some instances be parametrically defined, rather than explicitly enumerated. For example, the set of suitable physical locations for a given sink might be defined as any point on a particular line. Such parametric definition of possible sink and source locations eases the computational task involved in determining the location of minimum length wiring paths to be discussed below.

Other information which is needed and available for the design of a signal distribution tree includes: (1) data regarding each circuit used to drive the signal source, including its delay as a function of capacitive load and the maximum capacitive load it may drive; (2) the electrical characteristics, dimensions and spacing of the various types of available wiring which will be used to make the connections between sinks and the signal source. Such information allows one to take into account the delay effects in signal propagation caused by resistance, capacitance and inductance.

For the sake of clarity, FIG. 1 illustrates the simple case of a single signal source A which is to be connected to each of the four sinks A1, A2, A3 and A4. Also, it will be assumed that each of the sinks A1, A2, A3 and A4 require the same generating function.

The first step in the creation of a signal distribution tree according to the subject invention is sink pairing. The object of this step is to select two sinks which may be driven through a single connecting wire from an appropriate driving point. It will be appreciated that wire length can be minimized by pairing sinks which are physically close to each other. Furthermore, the expense associated with adjusting signal arrival times at the paired sinks will also be held to a minimum if the sinks in the pair have similar latency requirements. Thus, it is desirable to pair sinks which are physically close and which have similar latency requirements. In the event that there are an odd number of sinks to be connected to a particular signal source, the one sink left unpaired should tend to be the sink with the smallest relative latency requirement, that is, the sink which is to receive the signal first. The reason for this, as will be more fully appreciated below, is that the odd sink is likely to be connected closer to the signal source than the other sinks.

The pairing step may be done in a variety of ways using any one of several well known computer-aided clustering techniques known to those skilled in the art. One such technique, for example, begins by starting with an arbitrary pairing and uses simulated annealing procedures based upon a cost function including the physical distance between sinks and the difference in relative arrival times. In other words, the cost function used to evaluate any particular pairing imposes a cost for pairs of sinks attributable to the distance between the sinks because of the cost of wire required and attributable to a difference in latency requirements because of the need to insert circuit components to delay the signal to one of the sinks. If desired, additional factors affecting cost can be included. One such additional factor might be the ease with which a given pair of sinks can be connected. This may involve the consideration of data relating to circuit elements whose location has already been determined and the consideration of anticipated congestion on the chip. It should be understood that the concept of "cost function" is a general one commonly referring to monetary cost, but it can refer to other factors as well. The choice of factors to be considered rests with the engineer designing a given signal distribution network because the subject invention can be used with various factors and combinations of factors affecting cost.

If it is desired that certain sinks be buffered by no more than some maximum number of buffering stages, only those sinks having the same limitation on the number of buffering stages will be paired, assuming the appropriate instructions are entered into the computer or otherwise followed.

For purposes of illustrating the method of this invention, it is assumed that application of the foregoing or similar considerations results in pairing sinks A1 and A2 and sinks A3 and A4 of FIG. 1. Although FIG. 1 shows only four sinks, it will be understood that there are usually a much greater number of sinks to be connected to a particular source.

The next step in applying the method of this invention is to determine all acceptable wire connection paths within the constraints of a set of rules for path selection. For example, the normal objective in selecting such paths is to minimize cost and therefore, the length of wire used. Also, there are normally certain physical constraints which bear upon path selection such as the use of rectilinear wiring having no more than two changes in direction between points to be connected. Of course, it is possible in many cases to generate a great number of paths. As a practical matter, however, those paths not being within a selected range of cost deviation from the minimum cost path or paths will be excluded from consideration. Selection of the most desirable wiring paths can be accomplished with the use of any one of several computer-aided routing techniques, such as maze routing, known to those skilled in the art.

If one or both of the sinks in a pair have a set of alternate physical locations, only those locations which result in an acceptable path, as defined by the chosen constraints, are used, thus eliminating in most cases all but one or a small number of such physical locations. Acceptable paths may be defined parametrically rather than being explicitly enumerated. For example, such paths may be defined as all horizontal wires across a rectilinear bounding box defined by a pair of points to be connected and the vertical segments connecting them to the points. Again, such parametric definitions tend to facilitate the data processing associated with locating drive points as discussed below.

If the total capacitive load of the wiring for the optimum connecting path or paths, when added to the capacitive load of both sinks, is greater than that which can be driven by the signal source or by any of the available buffers carrying the signal in question, a buffer is added at one or both of the sinks to drive them. This effectively changes both the latency requirements and input capacitance of the sinks and the initial specifications for the sinks under consideration must be updated accordingly as the choice of a driving point for such path or paths will be affected.

Figure 2:
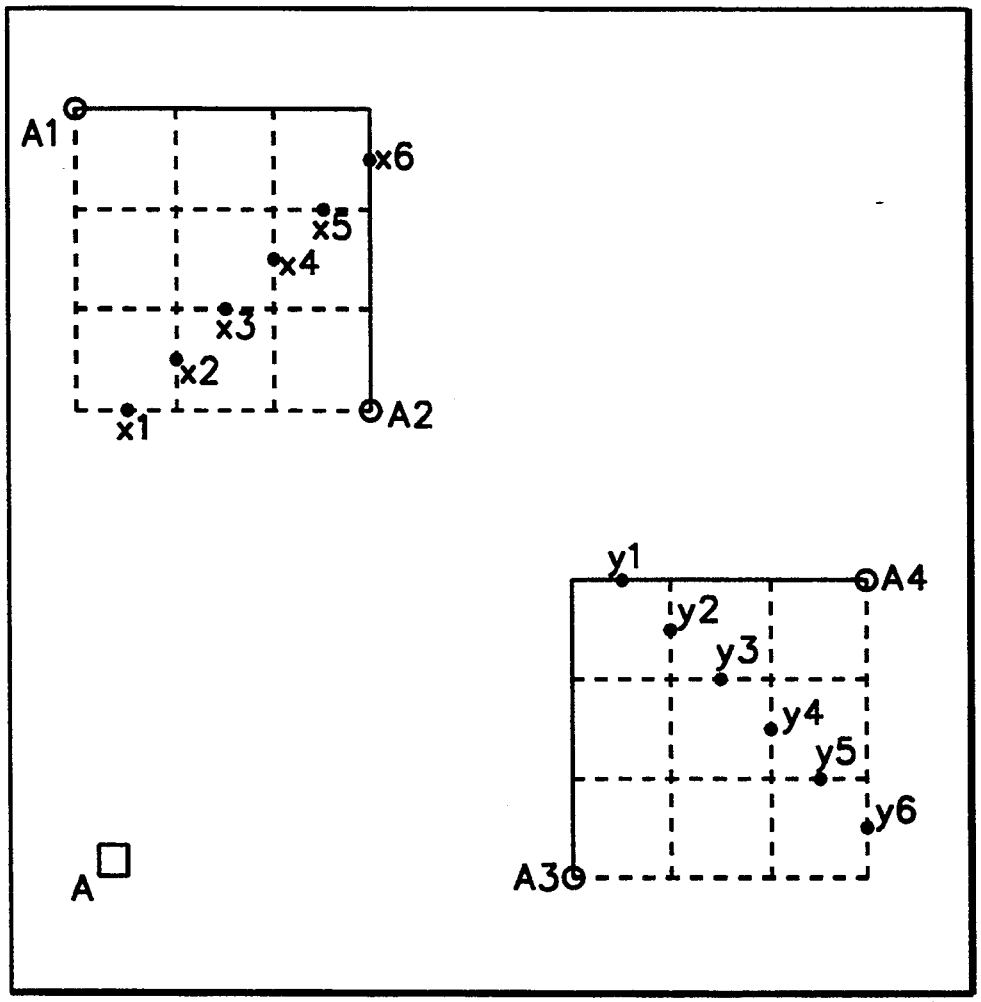
FIG. 2 schematically illustrates a number of possible minimum length wire connection paths between paired sinks and driving points on those paths.

FIG. 2 illustrates the path selection step for paired sinks A1 and A2 and paired sinks A3 and A4. In FIG. 2, a rectilinear wiring approach is assumed and the various permissible wiring paths are indicated by broken lines. One acceptable path is illustrated by a solid line connecting sinks A1 to sink A2 and, similarly, connecting sink A3 to sink A4. Assuming that it is desired to have no more than two changes in direction of the wiring, it will be appreciated that there are two routes along the perimeter of each of the bounding boxes illustrated. In addition, there are a number of acceptable routes which proceed first in a horizontal direction, then in a vertical direction and again in a horizontal direction yielding the familiar Z pattern. Note that all of these acceptable paths or routes are of the same minimum length. Although FIG. 2 shows only four horizontal and four vertical path possibilities, it should be understood that there can be many more.

The next step in the method of the subject invention is establishing a driving point on each acceptable wiring path which will satisfy the latency requirements of each of the sinks it connects. In other words, the driving point to be established is selected as that point which, upon the application of the signal thereto, will result in the delivery of that signal to each of the sinks at a time satisfying its latency requirement relative to the other sink in the pair. Thus, if the latency requirements for the two sinks are the same, the driving point will be the midpoint of the path, assuming the use of a wire having uniform electrical characteristics. If L1 and L2 are the relative latency requirements of the first and second sink of the pair being connected, respectively, and DP1 and DP2 are the delays from a candidate driving point P to these respective sinks, these delays being computed as a function of the location of the candidate driving point, the driving point location required to satisfy the required skew between the sinks is computed by setting L1 minus DP1 equal to L2 minus DP2 and solving the equation for the driving point location. It should be understood that different methods are well known for calculating the delay from the driving point to the sinks, and for each, well known algebraic or numeric techniques can be used to solve for the desired driving point location. The value L1 minus DP1 is also the relative latency requirement of the driving point when it is treated as a sink in later steps of the invention as discussed below.

Should it happen that the latency requirement of the two sinks being connected cannot be satisfied in this manner, one of several adjustments can be made in coordination with the selection of the driving point. For example, the driving point can be selected as the sink with the smallest latency requirement and a capacitive load circuit can be added to the signal close to the other sink, thus increasing the effective input capacitance of that sink and the RC delay of the path to that sink. Alternatively, a buffer circuit can be added to delay the signal at the sink with the longest latency requirement. Where either sink consists of a set of physical points rather than a single one, another alternative may be to join a point for which the wiring path is greater than the minimum possible path, thus increasing the RC delay between the points. In making adjustments such as those here suggested, the lowest cost alternative would be chosen, assuming that to be the primary consideration in creating the intended signal distribution tree. FIGS. 4–7 and 8–9 and the description associated therewith will illustrate additional situations in which various components and other adjustments can be made to achieve an optimum low cost set of wiring paths and drive points. The adjustments described above and with respect to those figures and all similar adjustment techniques are regarded as falling within the scope of this invention and the claims set forth below. Such adjustments are intended to be included as ways of accomplishing the pairing, path determining and drive point establishing steps described herein.

As shown in FIG. 2 a suitable drive point can be established for each of the possible acceptable wiring paths. In the case of sinks A1 and A2, these drive points are designated as X1, X2 ... X6. In the case of sinks A3 and A4, these drive points are indicated at Y1, Y2 ... Y6. As illustrated, these drive points are not at midpoints on the various paths, thus indicating that the latency requirements for the involved sinks differ. Thus, the result of the steps described above is the establishment of a set of possible wiring paths and drive points for each pair of sinks processed.

The next step in the method of this invention is to treat each set of drive points as a new sink with several alternative physical locations. Thus, drive points X1, X2 . . . X6 will be treated as one sink and drive points Y1, Y2 . . . Y6 will be treated as another sink. Original sinks A1, A2, A3 and A4 are removed from the list of sinks to be processed, thereby yielding a new number of sinks to be processed which is half the number of sinks originally paired, plus a possible additional sink if there was an odd one at the beginning.

As noted above, the method of this invention proceeds after the initial selection of drive points by treating each set of drive points as a new sink. This means that the steps of pairing, determining wire paths and establishing drive points will be applied to the sets of drive points such as X1, X2 . . . X6 and Y1, Y2 . . . Y6. This, of course, will result in further sets of drive points, thus creating another level of the distribution tree. Assuming a number of original sinks greater than the four illustrated, this process is carried on iteratively until a single set of drive points remains. Once that occurs, the method proceeds to the next step of connecting the signal source to one of the drive points of the single resulting set of drive points.

To accomplish the step of connecting the signal source to one of the points in the single resulting set of drive points, all acceptable wire connection paths to the drive points are determined and one having a minimum cost is chosen for connection to the source. That choice, of course, results in the selection of a particular driving point from the set of driving points established in the last iteration of the pairing, determining and establishing steps of this invention as described above. Selecting that driving point for connection to the signal source necessarily results in the selection of a particular wiring path between the sets of driving points or sinks resulting from the next prior iteration. Similarly, selection of that particular wiring path results in the selection of the two driving points resulting from the second prior iteration. Selection of those two driving points necessarily results in the selection of the two particular wiring paths between the sets of driving points or sinks resulting from the third prior iteration, and so on. It will be appreciated that selection of the final driving point for connection to the signal source determines the driving points and wiring paths from the root of the tree to the original sinks, frequently referred to as "leaves" of the tree. It will also be appreciated that any deferred decisions about which one of a set of drive points is to be used are made through the choice of the final drive point for connection to the signal source.

Figure 3:
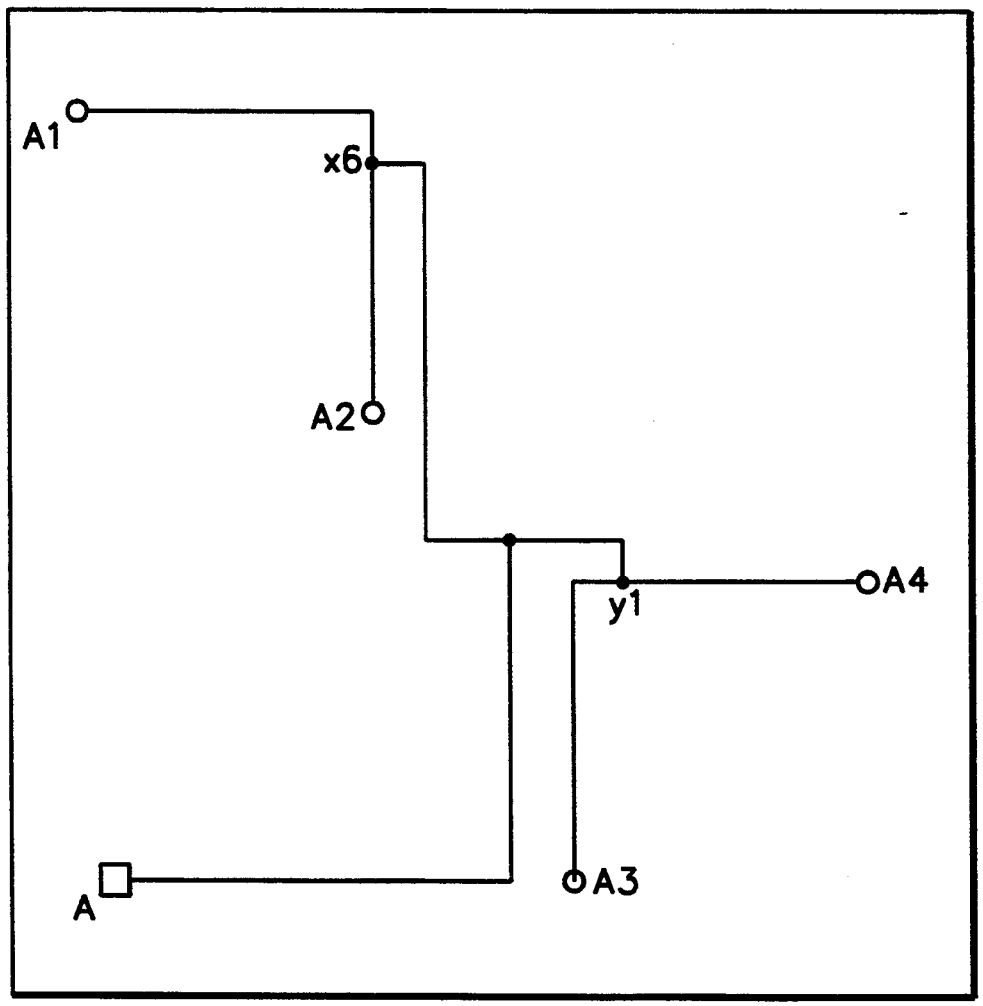
FIG. 3 is a schematic drawing showing a typical tree structure made according to the subject invention.

FIG. 3 shows a signal distribution tree which would be typical of that resulting from the use of this invention as applied to the pairing of sinks shown in FIGS. 1 and 2. For the sake of simplicity, no adjustment buffers or capacitive loads are indicated. Also, it should be understood that the precise configuration of any resulting signal distribution tree will depend not only on possible sink locations, but also upon the latency requirement and capacitive load associated with each sink. Finally, it should be noted that the circuit path from drive point X6 to drive point Y1 contains more than two changes in direction. Even if such a constraint were being followed, an exception is made where it is required to use a "jog" in order to space one wire path from another. Thus, the wire path in question is jogged slightly to space it from the wire running from sink A2 to drive point X6 and for the wire running through drive point Y1.

Figure 4:
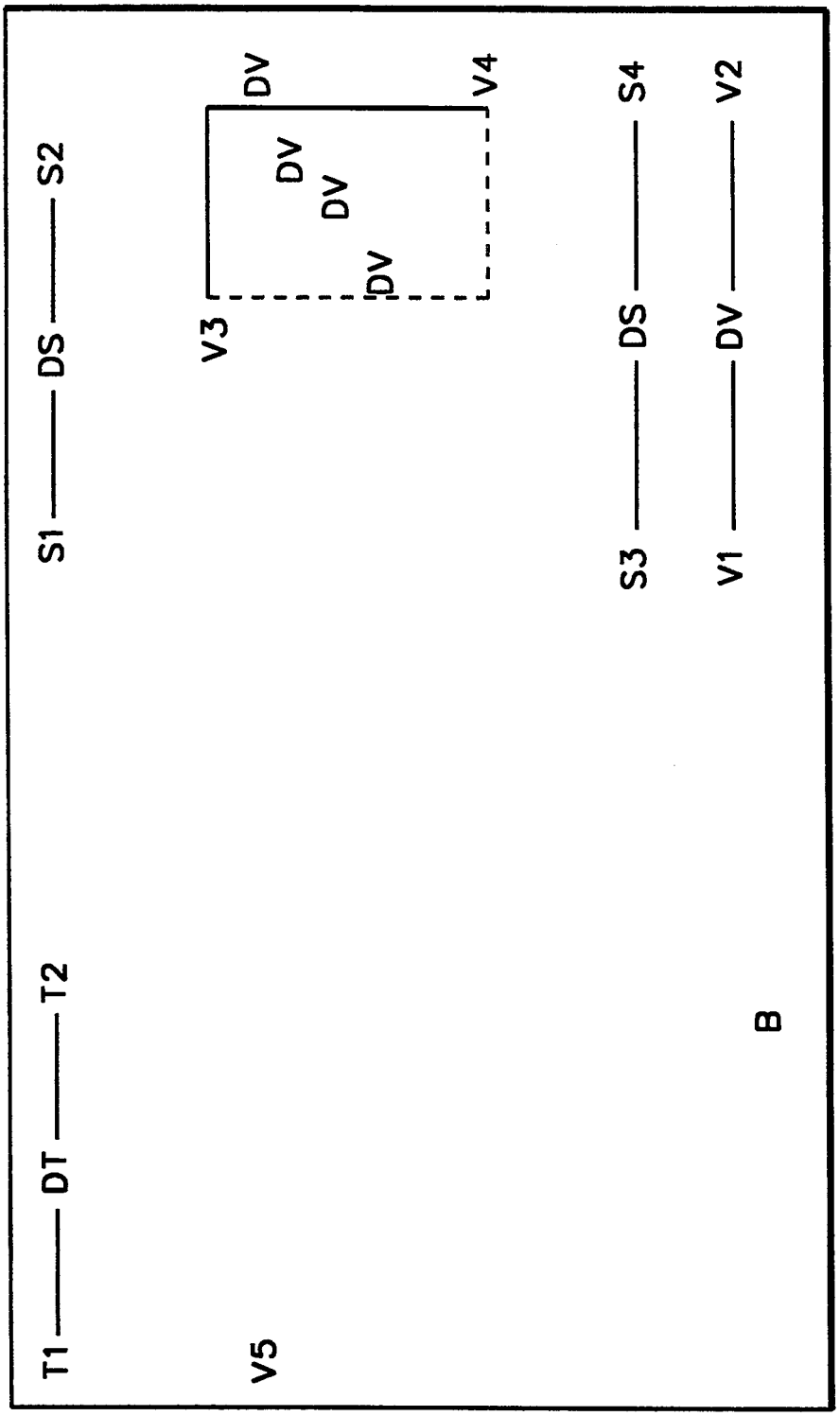
FIG. 4 schematically illustrates a circuit chip containing a number of paired sinks requiring different generating functions and a single signal source which must be connected to the sinks.

FIGS. 4–7 represent a commonly encountered situation in which many sinks are to be driven by the same signal source, but require different generating functions. This situation is commonly encountered when a single clock is to be gated by different signals at different sinks. In these figures, the point marked "B" is the source of the signal whose skew is to be balanced. Sinks marked T1 and T2 are to be driven by a certain generating function FT, sinks marked S1–S4 are to be driven by some different generating function FS and sinks marked V1–V5 are to be driven by yet another generating function FV. In FIG. 4 an initial pairing of these sinks is shown by the line or rectangle, as the case may be, representing the set of minimum cost routes for each pair. For example, sinks T1 and T2 are paired for connection along the minimum cost route designated by the line joining them through DT. DT designates a drive point for the pair T1 and T2. Similarly, sinks V3 and V4 are paired for connection along the several minimum cost routes illustrated by the bounding box. Also shown are a set of driving points DV and it will be understood that such points are established on other minimum cost routes (not shown). For simplicity, it is assumed that all sinks have the same relative arrival time requirement.

Note that in the initial pairing illustrated in FIG. 4, only sinks with the same generating function have been paired. This is so because typical pairing techniques used to evaluate possible pairings impose a cost for pairs of sinks with different generating functions as well as for sinks which have a higher estimated cost for their interconnection routes (i.e. they are farther apart), and which have differences in their relative arrival time requirements. But the cost imposition for pairs of sinks with different generating functions tends to be considerably higher. Otherwise, the S3–S4 pair and the V1–V2 pair might have been reversed to form pairs V1–S3 and V2–S4. The drive points required for a pair of sinks whose generating functions are the same will, of course, be required to generate the function in question.

Figure 5:
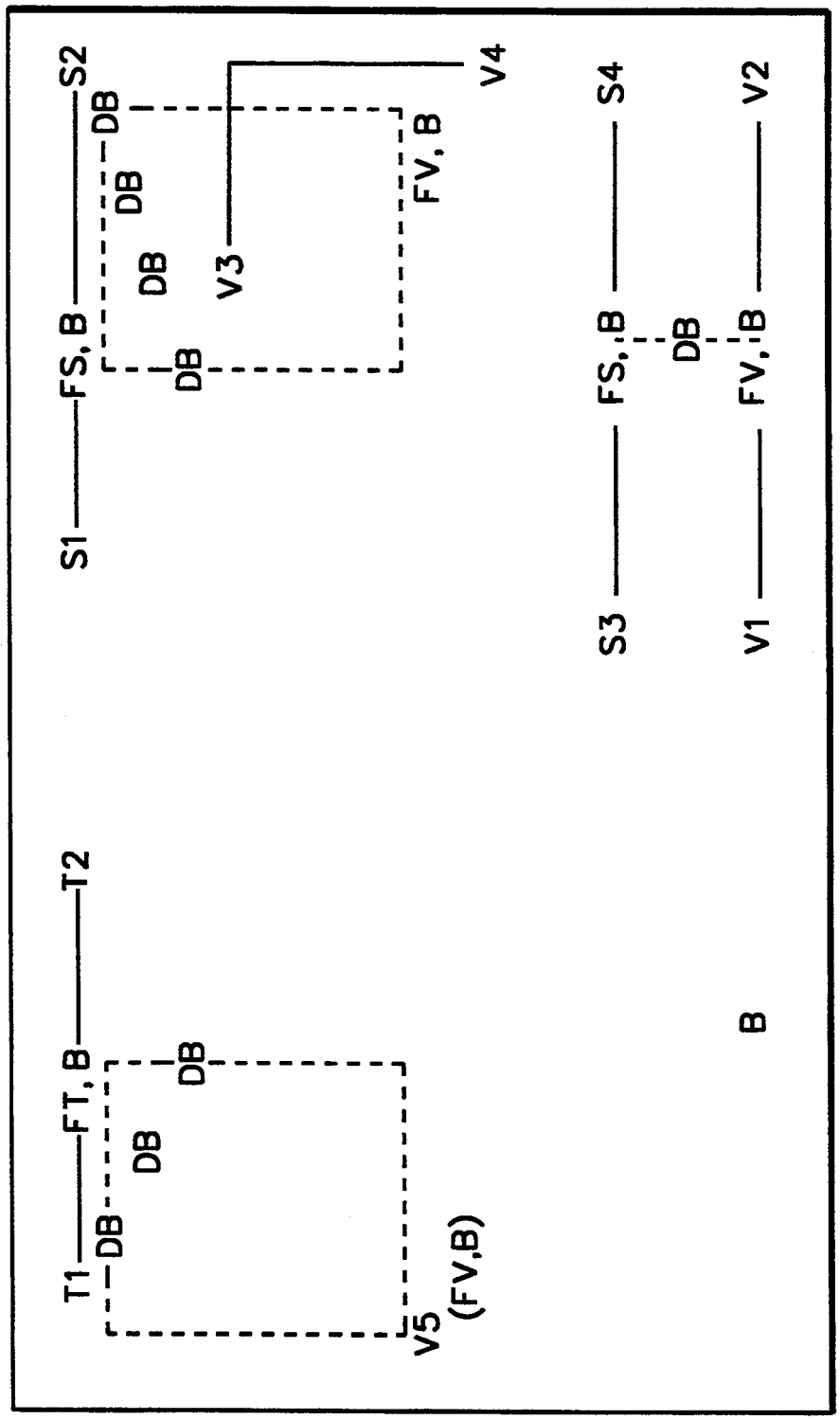
FIG. 5 schematically illustrates the results of the next iteration of the method of this invention on the drive points shown in FIG. 4.

FIG. 5 shows the next level of pairing in which the drive points or sets or drive points illustrated in FIG. 4 are paired. Note that in this instance, there are pairings involving different generating functions. For example, the drive points for the S3–S4 pair and that for the V1–V2 pair are paired. This would occur, for example, where the increased cost imposed because of the difference in generating functions for these pairs is less than the cost increase which would be imposed due to the greater physical separation of pairing other sinks with the same generating function, as, for example, pairing the two DS drive points and the set of DV drive points with the single DV drive point shown in FIG. 4.

Because the drive points being paired in FIG. 5 had different generating functions, it is necessary to insert generating circuitry at the drive points being paired. For example, generating circuitry must be inserted at the DS drive points (See FIG. 4) to convert them from an input requiring generating function FS to one requiring generating function FB. This is the meaning of the notation FS, B as shown in FIG. 5. Similarly, generating circuitry has been inserted at the DT driving point and the DV driving point to convert these from points requiring generating functions FT and FV, respectively, to input points requiring generating functions FB. Again, this is the meaning of the notations FT, B and FV, B respectively. It will be understood that the insertion of the generating circuitry at the drive points mentioned above results in pairings which can be driven by generating function FB. The appropriate drive points have thus been labeled DB.

Figure 6:
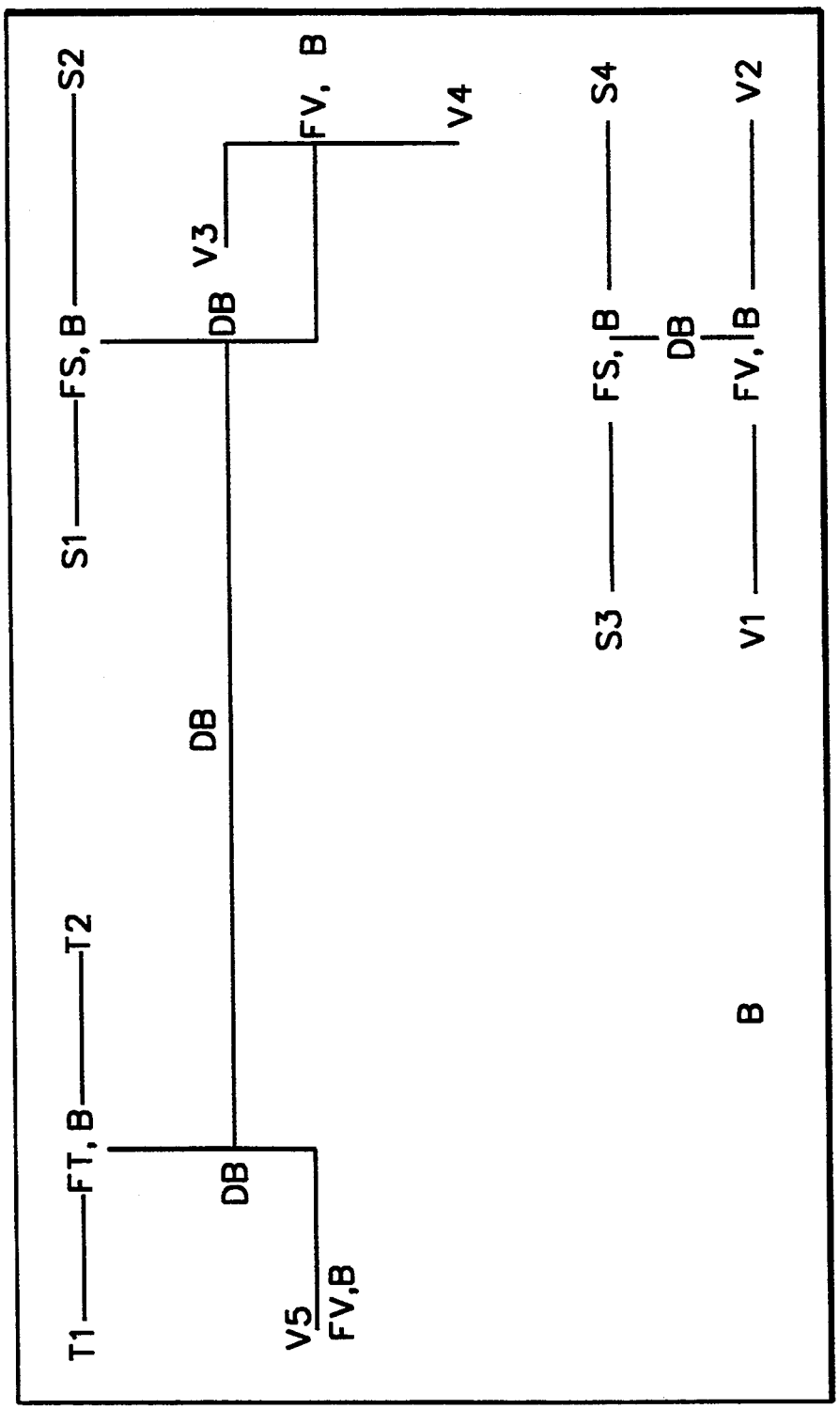
FIG. 6 schematically illustrates the results of the next iteration on the drive points shown in FIG. 5.
Figure 7:
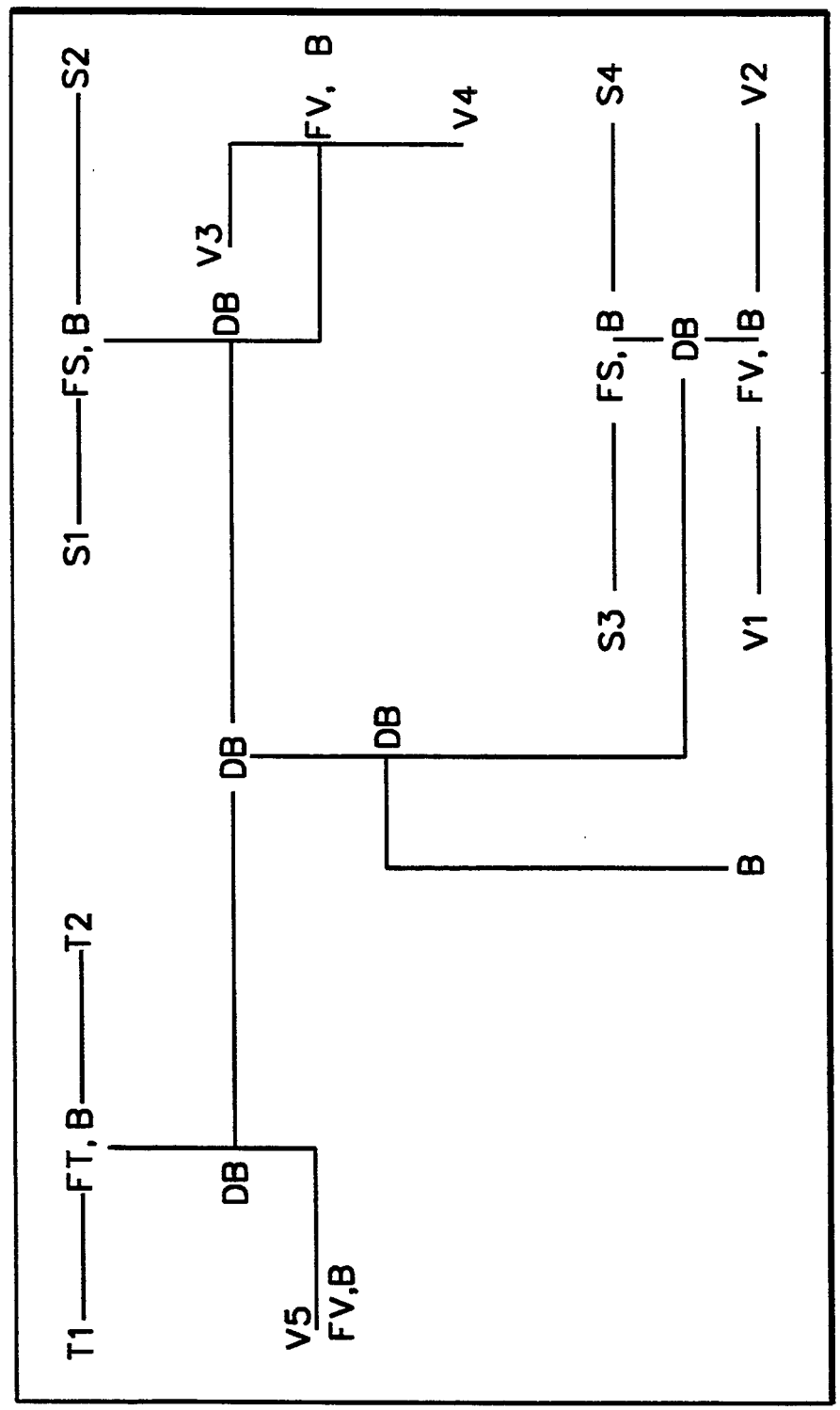
FIG. 7 illustrates the final signal distribution tree configuration resulting from the application of the method of this invention to the drive points shown in FIG. 6.

FIG. 6 shows the next stage of pairing. Since the generating functions have been inserted as described above, the new generating functions of all driving points to be paired are FB, and thus, no cost penalty is incurred on this pairing step for pairing sinks with different functions. FIG. 7 shows the final pairing and connection of the final single drive point to the signal source B.

Figure 8:
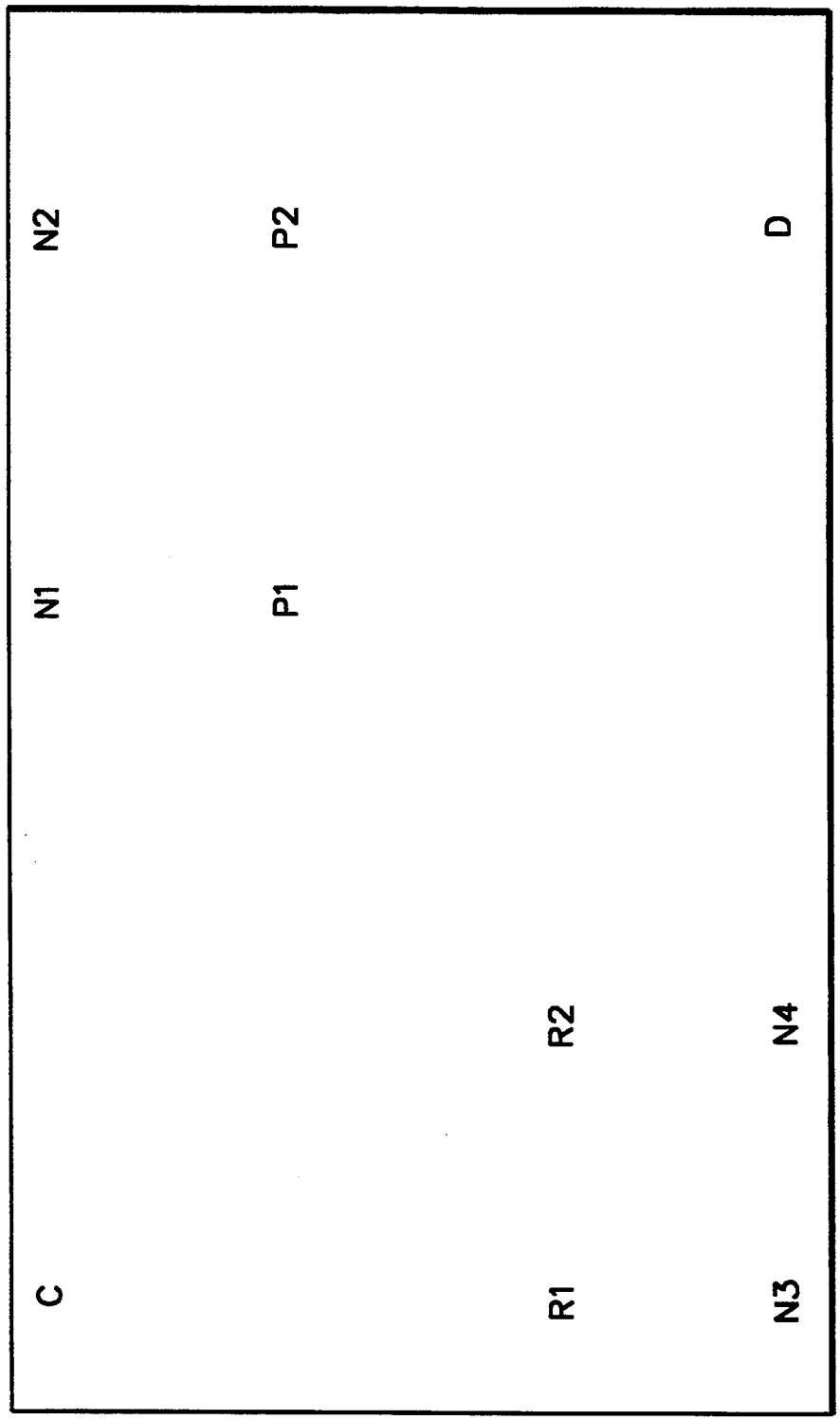
FIG. 8 illustrates another common situation on a circuit chip in which a number of sinks requiring different generating functions and inputs from more than one signal source.
Figure 9:
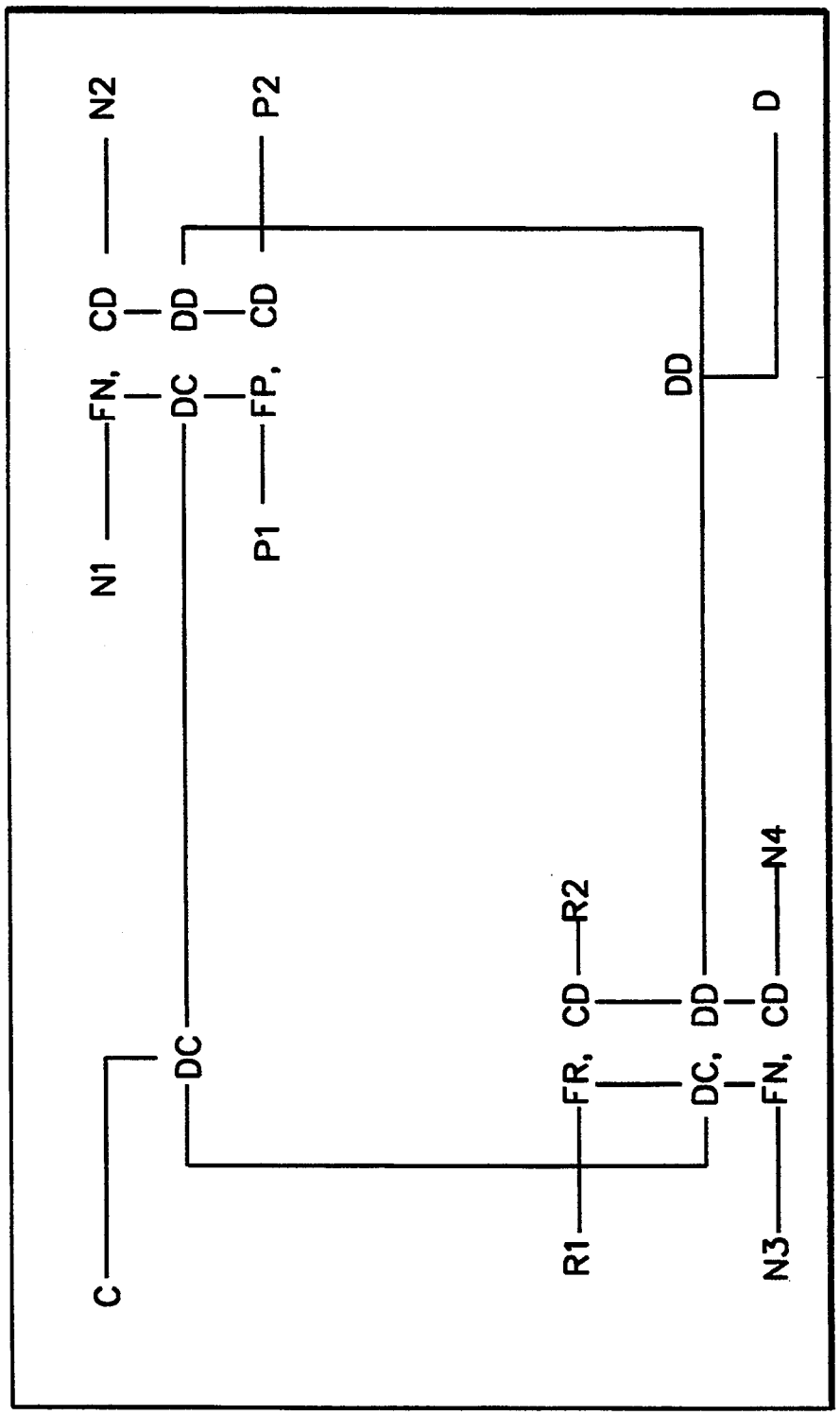
FIG. 9 schematically illustrates the signal distribution tree resulting from the application of the method of this invention to the situation illustrated in FIG. 8.

FIG. 8 shows yet another situation which can arise in constructing a signal distribution tree. In this case it is assumed that the initial sinks N1–N4, P1, P2, R1 and R2 require generating functions comprised of signals from two sources, C and D, which signals are to be skew-controlled. For purposes of this explanation, it will be assumed that the sinks are to be paired as follows N1–N2, N3–N4, P1–P2 and R1–R2. It will be understood that each pair will be connected by a wire path between them having a driving point thereon (not shown). It will be understood that the pairs N1–N2 and N3–N4 require the same generating function, albeit one derived from a combination of the generating functions FC and FD, using notation consistent with that used in FIGS. 4–7. The next level of pairing (not shown) would include the drive points for N1–N2 and P1–P2 and the drive points for pairs R1–R2 and N3–N4. However, since the required generating functions differ, it is necessary to insert generating circuitry which will provide the needed generating function from generating functions FC and FD. As indicated in FIG. 9, this results in converting a single driving point requiring a certain generating function to one which will produce that function from a combination of signals. For example, the drive point between N1–N2 requires function FN. The insertion of appropriate components at the drive point converts it from one sink into two sinks which will work together to provide the necessary function from a combination of the signals C and D. Similarly, the drive point between sinks P1 and P2 (which becomes another sink) is converted into two sinks by the insertion of appropriate generating circuitry which will result in the delivery of the function FP from a combination of the signals C and D to sinks P1 and P2. The steps of determining acceptable wire routings to connect the sinks and the subsequent steps of selecting drive points and adding these drive points to the list of sinks to be connected must now be performed on both the pair of C inputs to the generating circuitry and on the pair of D inputs to the generating circuitry and, in general, to all pairs of inputs to the generating circuitry inserted at the two sinks which require the same generating function. If some inputs to the generating circuitry at either sink require a generating function different from that required by any of the inputs to the generating circuitry at the other sink, these inputs are added to the list of sinks to be processed in subsequent pairing steps.

This situation is commonly encountered when different internal clock signals are to be generated from combinations of other clock signals input to the chip. An approach like this is used in the signal distribution tree method of this invention when the cost of inserting the appropriate generating circuitry is less than the cost of creating separate trees for the distribution of the separate signals such as C and D.

Figure 10A:
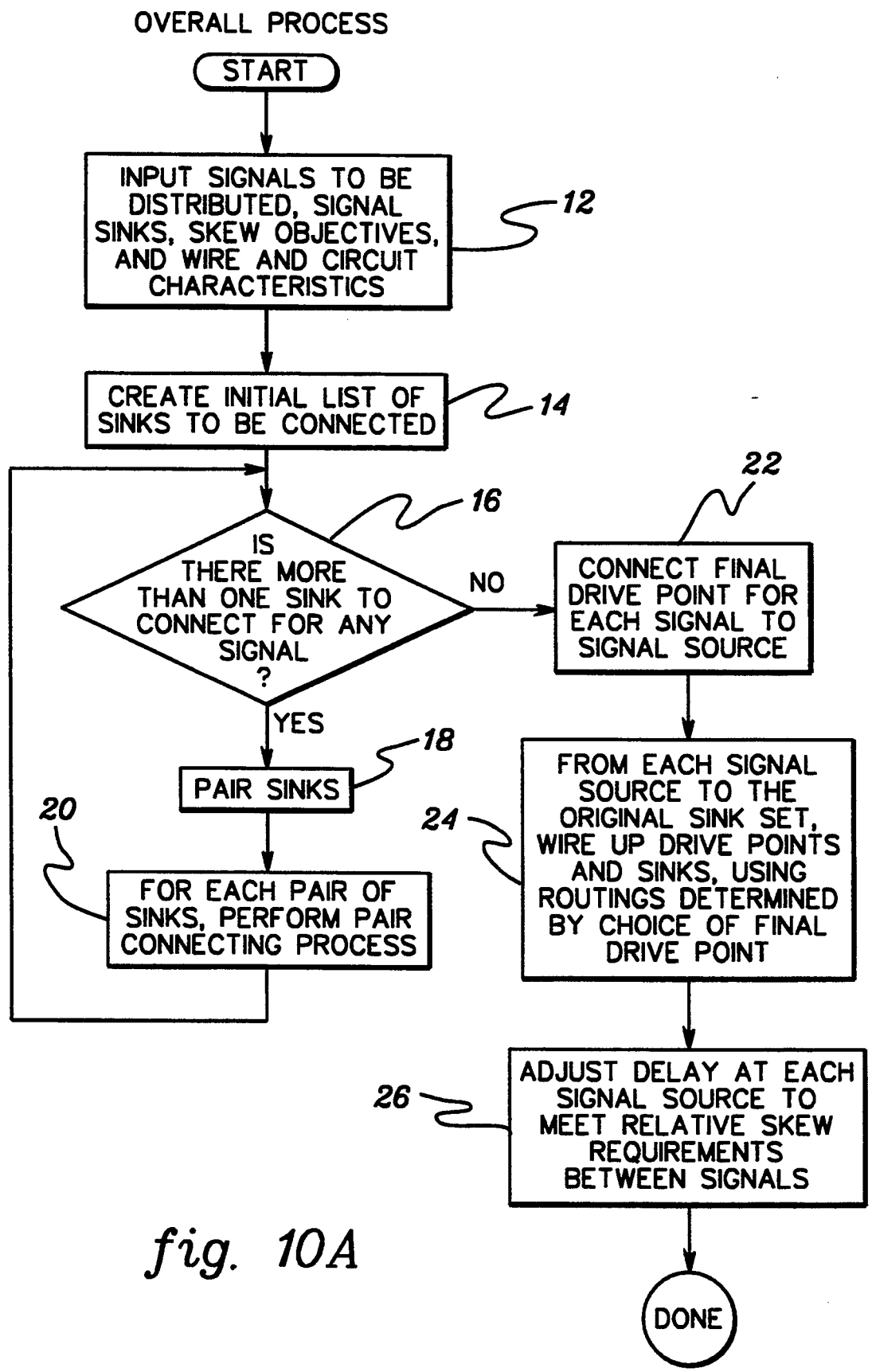
FIGS. 10A, B and C are a series of flow charts illustrating the steps to be followed in practicing the subject invention.
Figure 10B:
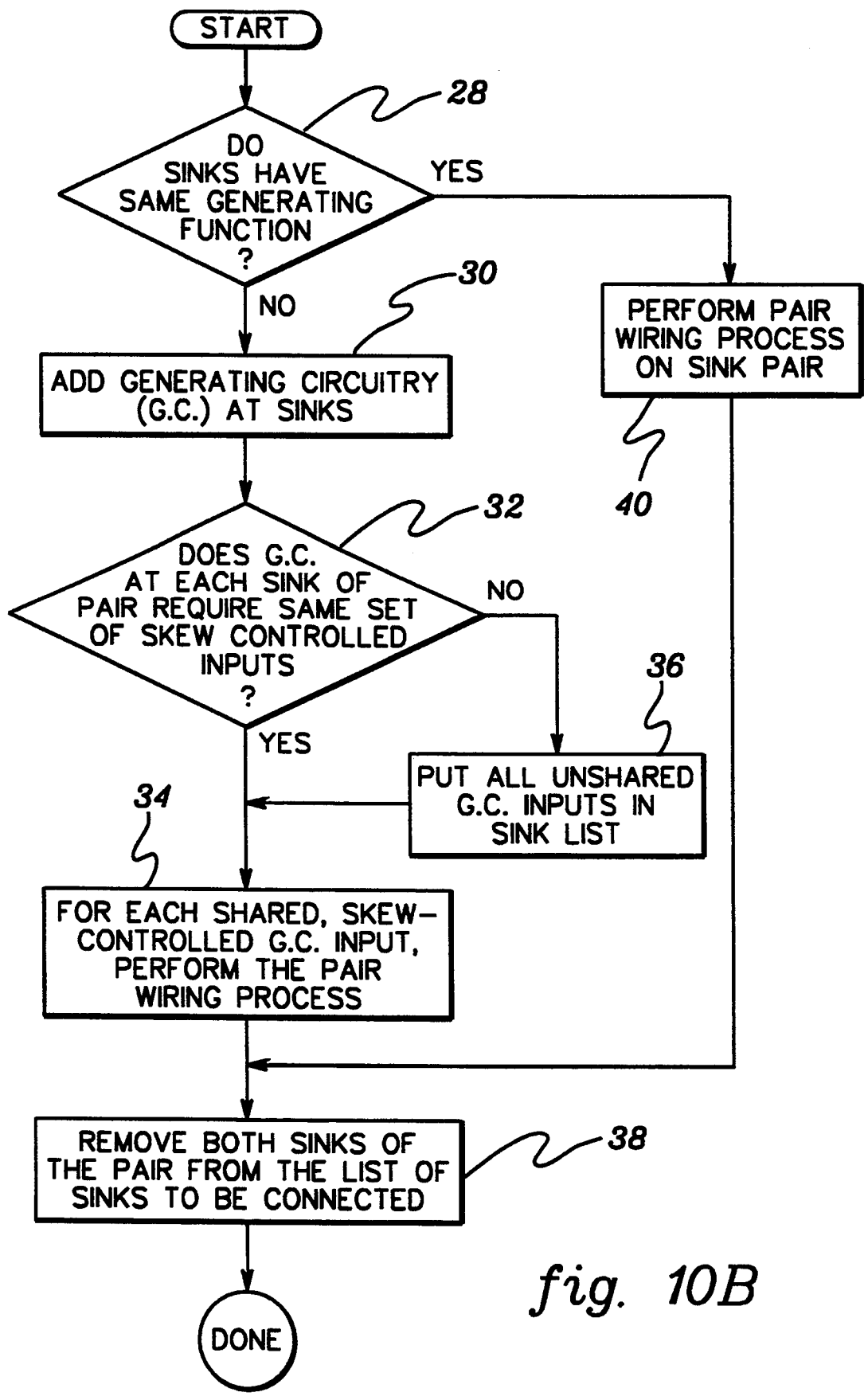
Figure 10C:
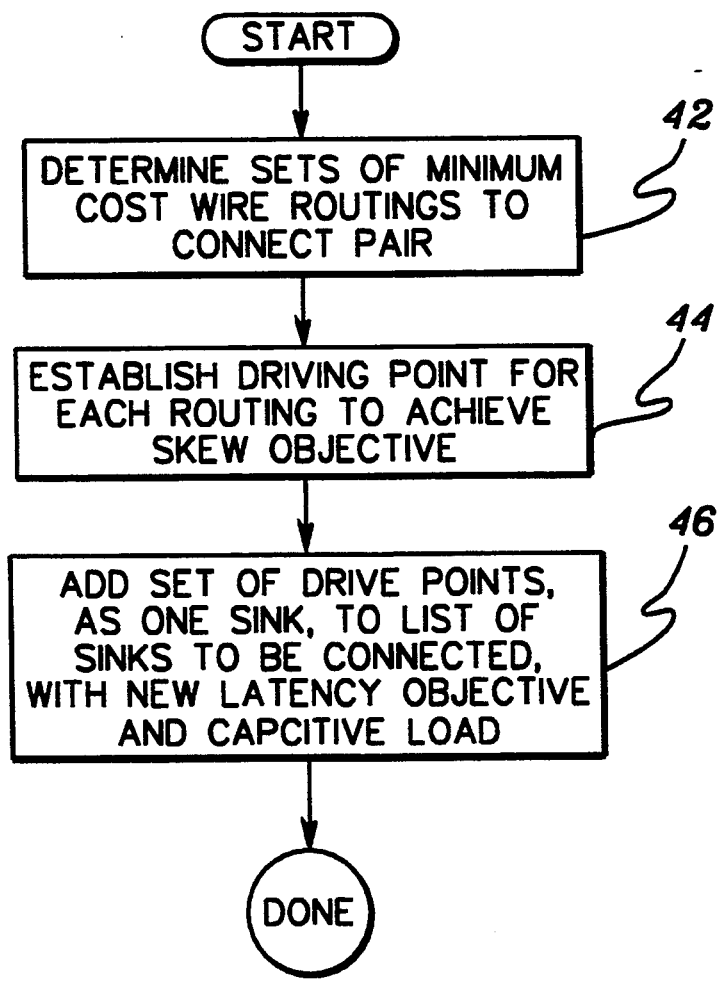

FIGS. 10A–C set forth a flow chart which describes the method of this invention. The process starts with instruction 12 indicating that the location of the sources of the signals to be distributed, the location of the sinks, the skew objectives and the wire and circuit characteristics are to be determined and inputted for processing. The flow then proceeds to the next instruction 14 which calls for the creation of an initial list of sinks to be connected. Flow then proceeds to diamond 16 which calls for a decision on whether there is more than one sink to connect for any signal. If the answer is yes, flow proceeds to instruction 18, "pair sinks". This instruction is carried out as described above. Flow then proceeds to instruction 20 which directs that for each pair of sinks, it is necessary to perform the PAIR CONNECTING process. The PAIR CONNECTING process is set forth in FIG. 10B and will be discussed below. Once all of the sinks have been processed according to the PAIR CONNECTING process, flow returns to diamond 16.

Once the processing has reached the point where there is only one sink to connect for any signal, the program flows to instruction 22 which calls for the connection of the final drive point for each signal to a signal source. The program will then execute the next instruction 24. Under this instruction, all of the drive points and sinks will be wired up using routings determined by the choice of the final drive point, as indicated above.

Following the completion of instruction 24 the program control flows to instruction 26 which calls for the adjustment of the signal delay at each signal source to meet the relative skew requirements between signals. This instruction is applicable where the chip, card or circuit board involved utilizes more than one signal source and where the distribution networks to be served by those signals have different latency requirements. In such a situation the process described with respect to FIGS. 1–3 would have been performed separately with respects to each signal and the object of this step is simply to insure that the proper skew requirements are met as the separate signals enter their respective distribution trees.

The PAIR CONNECTING process referred to at instruction 20 appears in FIG. 10B. It begins with inquiry 28, "do sinks have same generating function?" If the answer is yes, then the program control flows to instruction 40 which calls the PAIR WIRING process subroutine which will be discussed below.

If the answer to inquiry 28 is negative, program control flows to instruction 30 which calls for adding the appropriate generating circuitry as described above. Next, the flow is to inquiry 32 for a determination as to whether the generating circuitry at each sink of the pair under consideration requires the same set of skew-controlled inputs. If the response is negative, the flow is to instruction 36 pursuant to which all unshared generating circuitry inputs will be added to the sink list. After instruction 36 has been processed, flow proceeds to instruction 34. If the response to inquiry 32 is affirmative, the flow is directly to instruction 34 pursuant to which the PAIR WIRING process will be performed for each shared, skew-controlled generating circuitry input. Next the program control flows to instruction 38 which calls for the removal of both sinks of the pair under consideration from the list of sinks to be connected.

The PAIR WIRING process subroutine appears in FIG. 10C. It begins with the instruction 42 to determine sets of minimum cost wire routings to connect the pair of sinks in question. Once that instruction 42 has been completed the program proceeds to the next instruction 44 which is to establish a driving point for each routing which will result in achieving the skew objective for the sinks in the pair under consideration. Finally, the program proceeds to instruction 46 which calls for adding the set of drive points, as one sink, to the list of sinks to be connected with new latency objective and capacitive load data.

Figure 11:
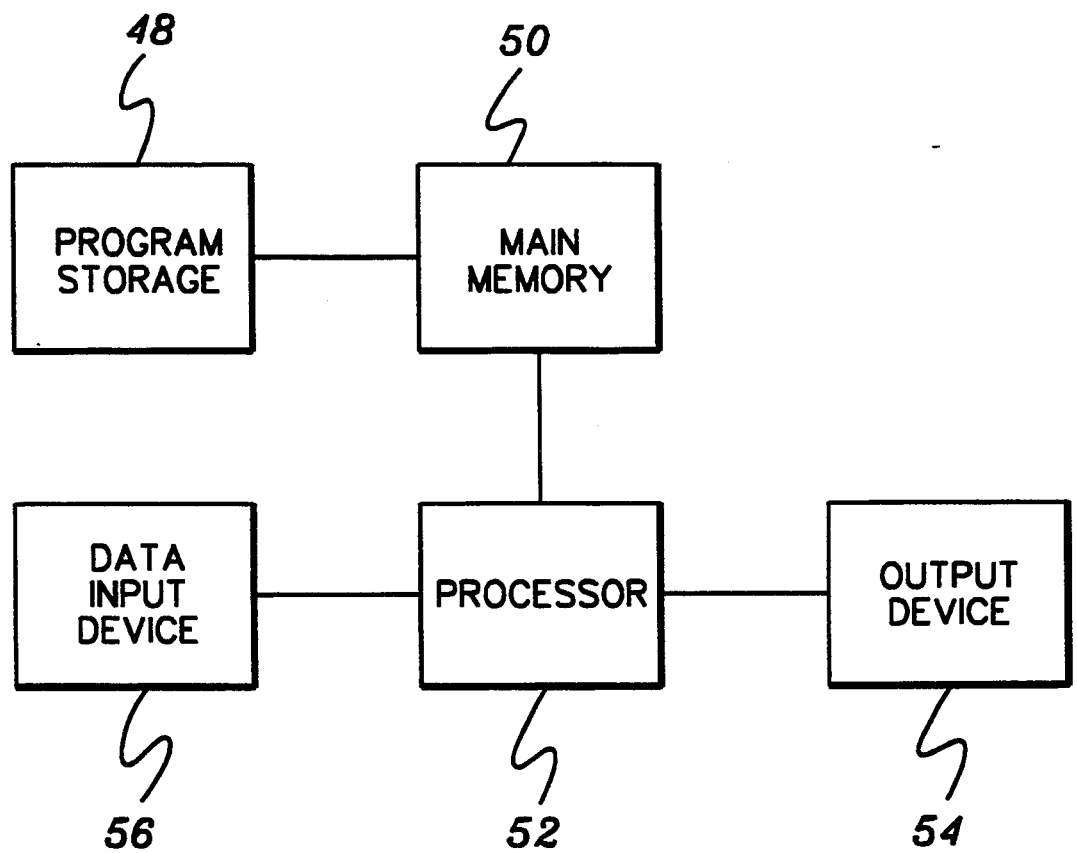
FIG. 11 is a block diagram illustrating the apparatus of the subject invention.

FIG. 11 is a block diagram showing how the subject invention is implemented. In general, FIG. 11 shows the organization of a computer having a processor 52 and a main memory 50. Programs for executing the process steps described above are stored in a suitable memory as illustrated by program storage 48. Data input equipment is shown at block 56 for inputting the appropriate data described above relating to the original sinks, signal sources, wire types, etc. Processor 52 is provided for executing the steps described above with respect to the particular data being processed. Output device 54 is provided for generating the resulting signal distribution tree with all finally determined paths and drive points. The output may be in any form suitable for actual fabrication of the signal distribution tree, including, for example, schematic diagrams or data for guiding the operations of fabrication equipment.

Clearly there are many modifications which could be made to the above described invention without departing from its essence. It is intended to encompass all such modifications within the scope of the following claims:

What is Claimed is:

1. A method for making a skew-controlled signal distribution network for feeding an electrical signal from a signal source to a plurality of sinks in a logic network where the location of the source in the network is known and a discrete number of possible locations, relative latency requirement and input capacitance of each sink is known, comprising the steps of:
   (a) pairing the sinks to be connected within the constraints of a chosen set of pairing rules;
   (b) determining for each pair of sinks at least one wire connection path within the constraints of a chosen set of wiring rules;
   (c) establishing at least one drive point on each path which will result in the delivery of a signal applied thereto to each of the sinks in the associated pair for that path at a time satisfying its latency requirement relative to the other sink in the pair;
   (d) iteratively applying steps (a), (b) and (c) to the sets of drive points established in the first application of those steps as though those drive points were sinks and then to each set of drive points established by each iteration so as to create a converging tree of drive points until a single set of drive points is established;
   (e) connecting the signal source to one of the drive points in the single set;
   (f) connecting the drive points which were paired at each successive fanout level in the tree; and
   (g) connecting the last fanout level of drive points to their associate pairs of sinks.

2. The method of claim 1 wherein the pairing rules in step (a) comprise constraints which result in pairing sinks which are physically close to each other and which have similar latency requirements.

3. The method of claim 1 wherein the wiring rules employed in step (b) result in the determination of at least one minimum cost wire connection path.

4. The method of claim 1 wherein the establishing step (c) comprises adding a circuit component to achieve the latency requirement of each sink in a pair relative to the other.

5. The method of claim 4 wherein the circuit component added is a capacitive load circuit.

6. The method of claim 4 wherein the circuit component added is a buffer circuit.

7. The method of claim 1 wherein the wiring rules employed in step (b) result in at least one wire connection path which is at least long enough that the RC delay along said wire connection path from the sink with the earlier relative latency requirement to the sink with the later relative latency requirement is greater than or equal to the difference in the relative latency requirements of the sinks joined by said wiring path.

8. The method of claim 1 wherein at least one of the sinks being fed with a signal requires a different generating function than the others and wherein the pairing step (a) includes the step, where necessary, of inserting generating circuitry at at least one of the sinks which will render the required generating function input for each of the sinks in the pair to be the same.

9. Apparatus for making a skew-controlled signal distribution network for feeding an electrical signal from a signal source to a plurality of sinks in a logic network where the location of the source in the network is known and a discrete number of possible locations, relative latency requirement and input capacitance of each sink is known, comprising:
   (a) means for pairing the sinks to be connected within the constraints of a chosen set of pairing rules;
   (b) means for determining for each pair of sinks at least one wire connection path within the constraints of a chosen set of wiring rules;
   (c) means for establishing at least one drive point on each path which will result in the delivery of a signal applied thereto to each of the sinks in the associated pair for that path at a time satisfying its latency requirement relative to the other sink in the pair;
   (d) means for iteratively applying means (a), (b) and (c) to the sets of drive points established in the first application of those means as though those drive points were sinks and then to each set of drive points established by each iteration so as to create a converging tree of drive points until a single set of drive points is established;
   (e) means for connecting the signal source to one of the drive points in the single set;
   (f) means for connecting the drive points which were paired at each successive fanout level in the tree; and
   (g) means for connecting the last fanout level of drive points to their associate pairs of sinks.

10. The apparatus of claim 9 wherein the pairing rules in paragraph (a) comprise constraints which result in pairing sinks which are physically close to each other and which have similar latency requirements.

11. The apparatus of claim 9 wherein the wiring rules described in paragraph (b) result in the determination of at least one minimum cost wire connection path.

12. The apparatus of claim 9 wherein the means for establishing (c) comprises means for adding a circuit component to achieve the latency requirement of each sink in a pair relative to the other.

13. The apparatus of claim 9 wherein at least one of the sinks being fed with a signal requires a different generating function than the others and wherein the pairing means includes means for inserting, where necessary, generating circuitry at at least one of the sinks which will render the required generating function input for each of the sinks in the pair to be the same.

14. The apparatus of claim 9 wherein the operation of the determining means (b) results in determining at least one wire connection path which is at least long enough that the RC delay along said wire connection path from the sink with the earlier relative latency requirement to the sink with the later relative latency requirement is greater than or equal to the difference in the relative latency requirements of the sinks joined by said wiring path.

15. A method of making a skew-controlled signal distribution network for feeding signals in a logic network from a plurality of signal sources to a plurality of sinks, at least some of which require differing generating functions comprised of signals from different signal sources, where the location of the signal sources are known and a discrete number of possible locations, relative latency requirement and input capacitance of each sink is known, comprising the steps of:
   (a) generating a list of sinks to be connected;
   (b) pairing the sinks to be connected within the constraints of a chosen set of pairing rules;
   (c) for any pair in which the sinks require differing generating functions, inserting generating circuitry at at least one of the sinks which will render at least one of the required generating function inputs for each of the sinks in the pair to be the same;
   (d) adding to the list of sinks to be connected any generating circuitry input resulting from an application of step (c) to a particular pair of sinks where the signal required for said generating circuitry input is not matched by the required signal of another generating circuitry input resulting from said application of step (c);
   (e) determining for each pair of identical generating function inputs resulting from steps (a) through (c) at least one wire connection path within the constraints of a chosen set of wiring rules;
   (f) establishing at least one drive point on each path which will result in the delivery of a signal applied thereto to each of the sinks in the associated pair for that path at a time satisfying its latency requirement relative to the other sink in the pair;
   (g) subtracting from the list of sinks to be connected any sinks to which steps (e) and (f) have been applied and adding to the list as a single sink any sets of drive points established in step (f);
   (h) iteratively applying steps (a) through (g) so as to create a converging tree of drive points until a single set of drive points is established for each signal source;
   (i) connecting each signal source to one of the drive points in its corresponding single set;
   (j) connecting the drive points which were paired at each successive fanout level on a tree by tree basis; and
   (k) connecting the last fanout level of drive points to their associated pairs of sinks.

16. The method of claim 15 wherein the pairing rules in step (b) comprise constraints which result in pairing sinks which are physically close to each other and which have similar latency requirements.

17. The method of claim 15 wherein the wiring rules employed in step (e) results in the determination of at least one minimum cost wire connection path.

18. The method of claim 15 wherein the wiring rules employed in step (e) result in at least one wire connection path which is at least long enough that the RC delay along said wire connection path from the sink with the earlier relative latency requirement to the sink with the later relative latency requirement is greater than or equal to the difference in the relative latency requirements of the sinks joined by said wiring path.

19. The method of claim 15 wherein the establishing step (f) comprises adding a circuit component to achieve the latency requirement of each sink in a pair relative to the other.

20. The method of claim 19 wherein the circuit component added is a capacitive load circuit.

21. The method of claim 19 wherein the circuit component added is a buffer circuit.

22. Apparatus for making a skew-controlled signal distribution network for feeding signals in a logic network from a plurality of signal sources to a plurality of sinks, at least some of which require differing generating functions comprised of signals from a plurality of signal sources, where the location of the signal sources are known and a discrete number of possible locations, relative latency requirement and input capacitance of each sink is known, comprising:
   (a) means for generating a list of sinks to be connected;
   (b) means for pairing the sinks to be connected within the constraints of a chosen set of pairing rules;
   (c) for any pair in which the sinks require differing generating functions, means for inserting generating circuitry at at least one of the sinks which will render at least one of the required generating function inputs for each of the sinks in the pair to be the same;
   (d) means for adding to the list of sinks to be connected any generating circuitry input resulting from an application of means (c) to a particular pair of sinks where the signal required for said generating circuitry input is not matched by the required signal of another generating circuitry input resulting from said application of means (c);
   (e) means for determining for each pair of identical generating function inputs resulting from the use of means (a) through (c) at least one wire connection path within the constraints of a chosen set of wiring rules;
   (f) means for establishing at least one drive point on each path which will result in the delivery of a signal applied thereto to each of the sinks in the associated pair for that path at a time satisfying its latency requirement relative to the other sink in the pair;
   (g) means for subtracting from the list of sinks to be connected any sinks to which means (e) and (f) have been applied and adding to the list as a single sink any sets of drive points established by means (f);
   (h) means for iteratively applying means (a) through (g) so as to create a converging tree of drive points until a single set of drive points is established for each signal source;

(i) means for connecting each signal source to one of the drive points in its corresponding single set;

(j) means for connecting the drive points which were paired at each successive fanout level on a tree by tree basis; and (k) means for connecting the last fanout level of drive points to their associated pairs of sinks.

23. The apparatus of claim 22 wherein the pairing means are effective to pair sinks which are physically close to each other and which have similar latency requirements.

24. The apparatus of claim 22 wherein the determining means are effective in the determination of at least one minimum cost wire connection path.

25. The apparatus of claim 22 wherein the operation of the determining means (e) results in determining at least one wire connection path which is at least long enough that the RC delay along said wire connection path from the sink with the earlier relative latency requirement to the sink with the later relative latency requirement is greater than or equal to the difference in the relative latency requirements of the sinks joined by said wiring path.

26. The apparatus of claim 22 wherein the establishing means (f) includes means for adding a circuit component to achieve the latency requirement of each sink in a pair relative to the other.

27. The apparatus of claim 26 wherein the circuit component added is a capacitive load circuit.

28. The apparatus of claim 26 wherein the circuit component added is a buffer circuit.

* * * * *